`US005848008A`

United States Patent [19]
Kirihata et al.

[11] Patent Number: 5,848,008
[45] Date of Patent: Dec. 8, 1998

[54] FLOATING BITLINE TEST MODE WITH DIGITALLY CONTROLLABLE BITLINE EQUALIZERS

[75] Inventors: Toshiaki Kirihata, Poughkeepsie, N.Y.; Hing Wong, Los Altos, Calif.; Bozidar Krsnik, St. Cloud, France

[73] Assignees: Siemens Aktiengesellschaft, Munich, Germany; International Business Machines Corporation, Armonk, N.Y.

[21] Appl. No.: 937,528

[22] Filed: Sep. 25, 1997

[51] Int. Cl.[6] ............................................. G11C 7/00
[52] U.S. Cl. ..................... 365/200; 365/201; 365/210; 365/185.09
[58] Field of Search ..................... 365/200, 207, 365/185.09, 210

[56] References Cited

U.S. PATENT DOCUMENTS

| | | | |
|---|---|---|---|
| 4,654,827 | 3/1987 | Childers | 365/201 |
| 4,868,823 | 9/1989 | White, Jr. et al. | 356/201 |
| 5,532,963 | 7/1996 | Kushiyama et al. | 365/201 |
| 5,574,729 | 11/1996 | Kinoshita et al. | 365/200 |
| 5,619,460 | 4/1997 | Kirihata et al. | 365/200 |
| 5,680,354 | 10/1997 | Kawagoe | 365/200 |
| 5,748,545 | 5/1998 | Lee et al. | 365/200 |

*Primary Examiner*—David Nelms
*Assistant Examiner*—Tuan T. Nguyen
*Attorney, Agent, or Firm*—Stanton C. Braden

[57] ABSTRACT

A method for generating a floating bitline test mode using digitally controllable bitline equalizers is provided. The method utilizes digitally controlled dummy timing cycles to detect a leaky bitline during the floating bitline test mode. A negative pulsed $\overline{\text{TEST}}$ signal is generated to cause the bitline equalizers to go low and cause the floating bitline state. The implementation of dummy timing cycles eliminates the need for additional external control of internal timings during a bitline test mode. Upon the termination of the dummy timing cycle, the normal read operation continues without interruption.

11 Claims, 3 Drawing Sheets

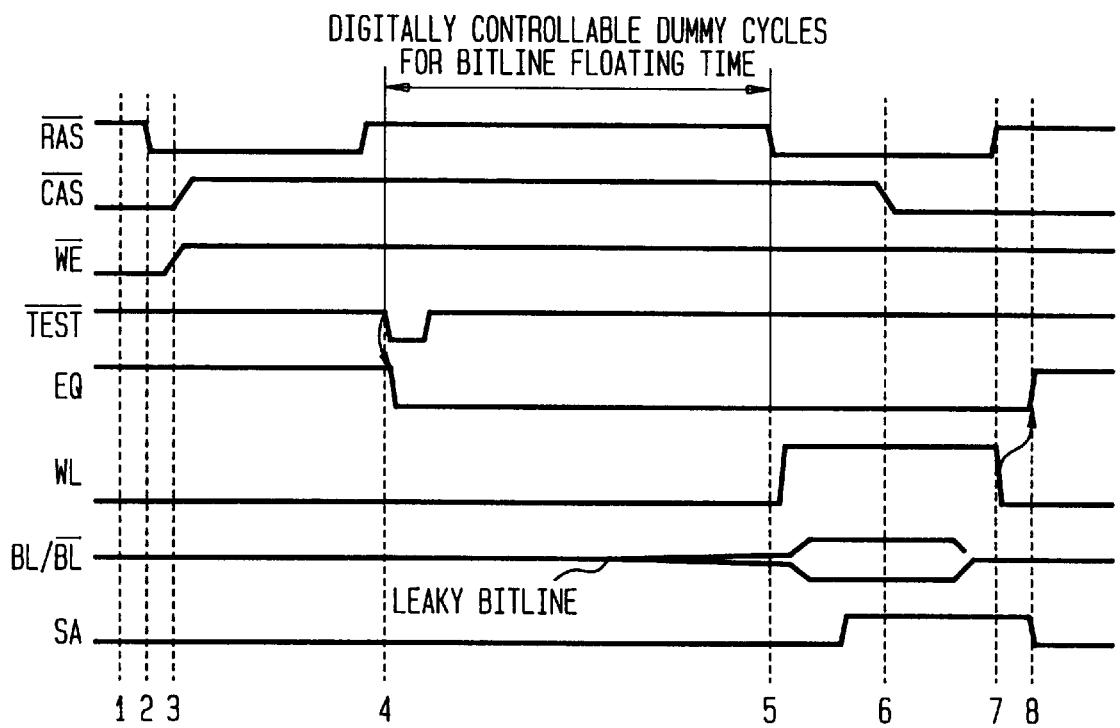
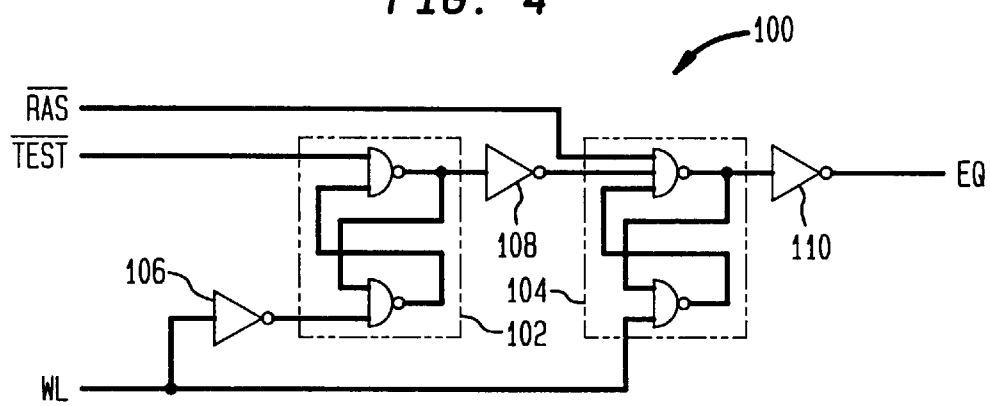

FLOATING BITLINE TEST MODE WITH DIGITALLY CONTROLLABLE BITLINE EQUALIZERS

BACKGROUND OF THE INVENTION

1. Field of the Invention

The present invention relates to the testing of Dynamic Random Access Memories. More specifically, it relates to a digitally controllable floating bitline test mode for DRAM's that can be performed during a wafer test.

2. Prior art

A DRAM includes a memory cell array for outputting holding data to a bitline when selected, and sense amplifiers for amplifying outputs. Memory cell defects and memory array defects have many sources and as a result, many signatures. While single, isolated cell failures may be scattered throughout the array, very often, multiple cells in the same vicinity fail. One characterization of these failures may be a bit (or column) line failure (i.e., failing cells with the same bit address). The sources of these failures vary, and as such, extensive on chip testing of memory arrays is required. The testing of these VLSI memory chips is a crucial process in their development and production.

One of the functional failures of the DRAM has been attributed to the leaky bitline (BL), which is primarily caused by short-circuiting between the BL and the wordline, WL. The leaky BL causes the BL voltage to drift during a signal development phase. This occurs when the BL is in a floating state due to the disabled BL equalizer and the sense amplifier not being set. The floating state in the signal development phase is generally set at 10 ns. A major leaky BL can be easily detected during an ICC5 test because the stand-by current (CMOS), is over specification (typically 100 $\mu$A). In stand-by phase, the BL equalizer is enabled, and the current is supplied to the BLs to hold the voltage.

A medium leaky BL, cannot be detected in the ICC5 test, but can be detected in a function test, since the leaky BL reduces the sensing voltage, which is typically 100 mV. The leaky BL causes more than 100 mV voltage drifts which results in a sensing failure. The detectable leakage current in the function test can be calculated by:

BL Capacitance(100fF)×BL Drift Voltage (100 mV)/time (5 ns) which is 2 $\mu$A.

A slightly leaky BL, which has less than 2 $\mu$A, can still pass the function test. However, the slightly leaky BL often causes a failure in a module test or burn-in test, thereby reducing the module and burn-in yield. Even if it still passes the module test, it may be defective in the field, and result in reliability problems.

If the BL floating state could be controlled by the test mode, a leaky BL can be more accurately detected by extending the BL floating state. This floating bitline test mode makes it possible to detect a leaky bitline in a wafer test. The detected defective BL can be repaired with column redundancy, thereby increasing the module yield, and improving reliability.

FIG. 1 shows a standard approach to generate a bitline floating state, in which a bitline sensing start is delayed by a predetermined time when a test mode is enabled. This method is inflexible, and has increased complexity because of the difficulty in determining a reasonable predetermined delay time during design.

Another floating bitline test mode shown in FIG. 2 includes the external control of internal timings. This type of test mode allows a bitline sensing start to be directly controlled by a VLSI tester. Although this increases the flexibility of the test mode, it requires the changing of other internal timings such as, column address set-up and hold times, data strobe, and cycle time according to the sense amplifier (SA) delay.

SUMMARY OF THE INVENTION

It is therefore an object of the present invention to provide a floating bitline test mode that has increased flexibility.

It is another object of the invention to provide a floating bitline test mode that does not require the changing of other control timings during the test.

It is a further object of the invention to generate a floating bitline for enabling a test mode that utilizes dummy timing cycles between the initiation of the test mode, and the starting of the normal read operation.

These and other objects of the invention are achieved by providing a floating bitline test mode for DRAM's with digitally controllable bitline equalizers. The test mode is enabled in the standard way by a Write CAS Before RAS (WCBR) cycle with address. The bitline floating time is digitally controllable by changing the number of dummy cycles between the time in which a test mode is enabled, and the time at which the read operation starts. By choosing a certain number of dummy cycles, a leaky bitline will be noticeably defective, while allowing normal bitlines to be non-defective. The number of dummy cycles selected is controllable by an operator through a VLSI tester. Once a leaky bitline is detected using this method, it is possible to repair the defective bitlines with column redundancy, which overcomes problems in yield reduction in module burn-in tests.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3 is a graphic representation of a floating bitline test mode with digitally controllable equalizers according to the present invention;

FIG. 4 is a schematic diagram of an embodiment of the equalizer control circuit according to the invention.

DETAILED DESCRIPTION OF THE INVENTION

Figure 1:
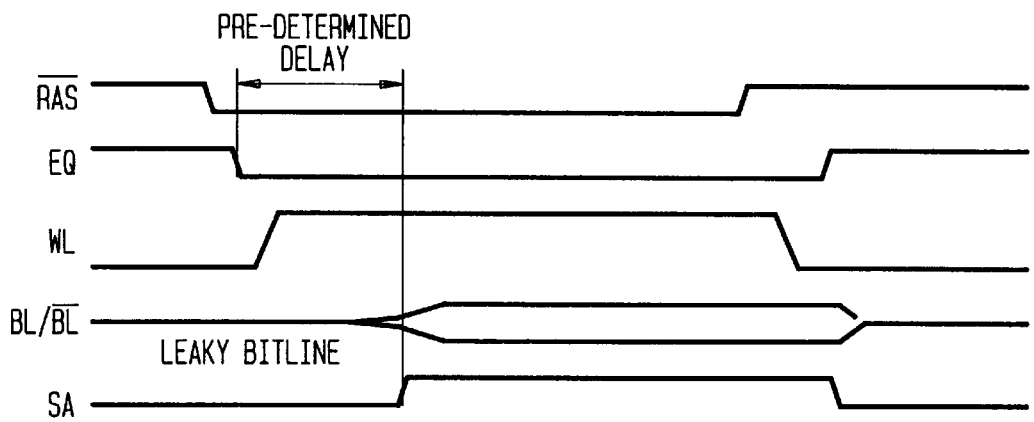
FIG. 1 is a graphic representation of a first floating bitline test mode according to the prior art.
Figure 2:
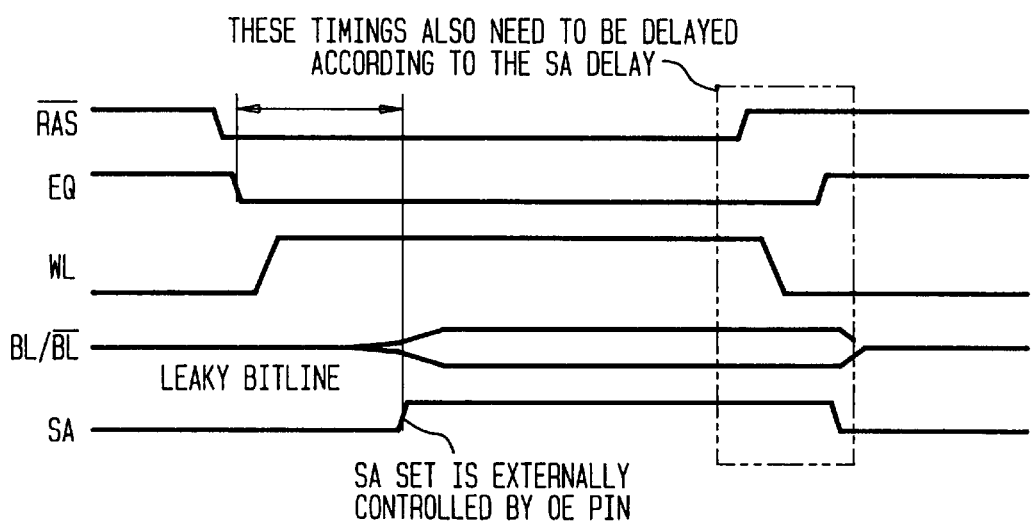
FIG. 2 is a graphic representation of a second floating bitline test mode according to the prior art.

The invention generally relates to semiconductor memories and particular to testing semiconductor memories during manufacturing. To facilitate discussion, the invention is described in the context of Dynamic Random Access Memories (DRAM). However, the invention is broader and is applicable to all types of semiconductor memories. Such memories, for example, include synchronous (DRAMs) and merged DRAM-logic (embedded) circuits.

Referring to FIGS. 3 and 4, the equalizer control circuit 100 according to the invention is shown. For purposes of simplification, it is assumed that the WCBR only activates a negative pulsed signal $\overline{TEST}$. However, in actual implementation, WCBR would need to allow a refresh operation. The NAND flip flops 102 and 104 and inverters 106, 108, and 110 are set to make EQ go high in a chip power up phase.

In normal read mode, equalizers in the corresponding sub-array are first reset when the row address strobe ($\overline{RAS}$) is enabled. Word Line (WL) is then activated, and after a signal development time, sense amplifiers are set. When $\overline{RAS}$ is disabled, word line (WL) is first reset, and after WL has been disabled, sense amplifiers (SA) are reset and equalizers (EQ) are enabled again.

When a test mode is enabled by detecting a WCBR cycle, pulsed signal $\overline{TEST}$ periodically goes down (state 4). As shown in FIG. 3, this negative pulsed $\overline{TEST}$ disables all equalizers (EQ) in all of the sub-arrays. When $\overline{RAS}$ is enabled (i.e., goes high), the read operation starts, as in a normal mode. The EQ signal which had been disabled remains low, while WL and SA work as if in a normal mode. This allows the determination of a leaky bitline BL/BL. The timing for this cycle is determined by the digitally controllable dummy cycles as depicted between timing states 4 and 5. As shown, a leaky bitline can be sufficiently leaked during the dummy timing cycles, resulting in a sensing failure.

When $\overline{RAS}$ is disabled (i.e., brought low) at the end of the dummy cycle, word line WL is first reset which subsequently disables SA. The Equalizers are automatically reset by detecting the time at which WL is disabled, as in a normal read operation.

The following state table shows the relation between equalizer signal (EQ) with respect to TEST, WL and RAS.

| Signal | Timing States | | | | | | | | | |
|---|---|---|---|---|---|---|---|---|---|---|
| | 1 | 2 | 3 | 4 | $4_0$ | $4_1$ | 5 | 6 | 7 | 8 |
| $\overline{RAS}$ | 1 | 0 | 0 | 1 | 1 | 1 | 0 | 0 | 1 | 1 |
| $\overline{CAS}$ | 0 | 1 | 1 | 1 | 1 | 1 | 1 | 0 | 1 | 1 |
| $\overline{TEST}$ | 1 | 1 | 1 | 0 | 1 | 1 | 1 | 1 | 1 | 1 |
| WL | 0 | 0 | 0 | 0 | 0 | 0 | 1 | 1 | 0 | 0 |
| SA | 0 | 0 | 0 | 0 | 0 | 0 | 0 | 1 | 1 | 0 |
| EQ | 1 | 1 | 1 | 0 | 0 | 0 | 0 | 0 | 0 | 1 |

As shown, when signal $\overline{TEST}$ is pulsed at timing state 4, EQ goes low to generate the floating bitline mode. EQ remains low until the next RAS is activated and disabled as in a normal random access mode. More specifically, the EQ remains low until the WL in the next random access mode is disabled. A number of dummy cycles $4_0$–$4_1$ are inserted until the next random access mode is started (state 5). This allows the time, at which BL is floated, to be digitally and flexibly controlled. When WL goes low at the timing state 7, SA goes low immediately thereafter (timing state 8), and EQ is reset in response to the disabled state of WL and SA.

In an alternative embodiment (not shown), only selected sub-array equalizers can be reset with address. In this mode, the signal EQ in the activated sub-array can be reset, and the read operation continued for the other sub-arrays.

Figure 5:
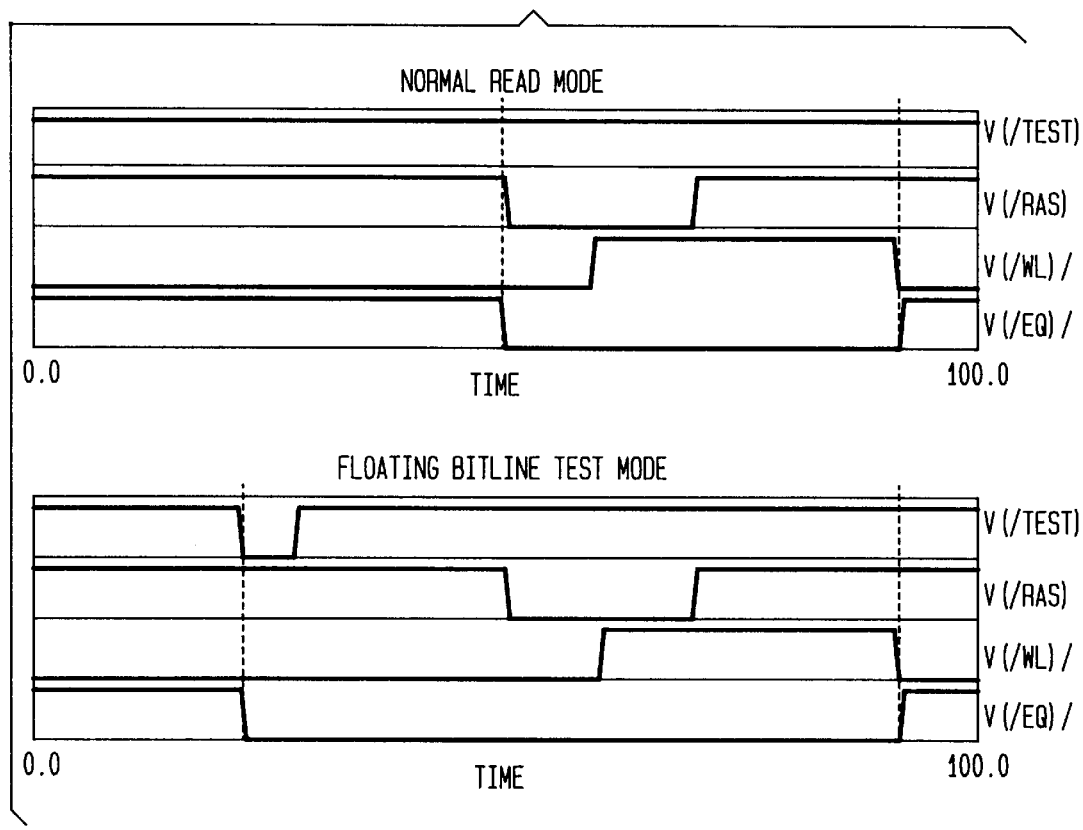
FIG. 5 is a graphic representation of simulated waveforms of the normal operation mode and the floating bitline test mode according to the invention.

FIG. 5 shows simulated waveforms for the normal read and floating bitline test modes. In normal read mode, when RAS is disabled, the EQ signal is also disabled, and the word line WL signal is subsequently enabled. When WL is disabled, EQ resets and returns to a high state. When operating in the floating bitline test mode, according to the invention, the negative pulsed TEST signal causes EQ to be disabled (i.e., go low). A number of dummy cycles are inserted until the next RAS activation. When the next RAS is activated, EQ remains low while RAS and WL operates as if operating in a normal mode, and when WL is disabled EQ resets and reutrns to a high state, thereby terminating the floating bitline mode.

Through the application of digitally controlled dummy cycles, the floating bitlines are easily controlled without requiring a change in any other timings. A VLSI tester can control the number of dummy cycles to be implemented for each floating bitline test mode.

It should be understood that the present invention is not limited to the particular embodiment disclosed herein as the best mode contemplated for carrying out the present invention, but rather that the present invention is not limited to the specific embodiments described in this specification except as defined in the appended claims.

We claim:

1. A method for detecting leaky bitlines in semiconductor memories comprising the steps of:

generating at least one dummy timing cycle;

disabling a bitline equalizer to create a floating bitline test mode; and detecting a defective bitline by reading from the semiconductor memory as in a normal mode.

2. The method according to claim 1, wherein said step of generating at least one dummy timing cycle is performed by a VLSI tester.

3. The method according to claim 1, wherein said step of disabling the bitline equalizer comprises the step of generating a negative pulsed TEST signal after a WCBR has been completed.

4. The method according to claim 3, wherein said at least one dummy timing cycle is initiated upon the disabling of the bitline equalizer.

5. The method according to claim 2, wherein said at least one dummy timing cycle is digitally controllable by the VLSI tester.

6. The method according to claim 2, wherein the number of dummy timing cycles is digitally controllable by the VLSI tester.

7. The method according to claim 1, further comprising the step of repairing a detected leaky bitline with a column redundancy.

8. The method according to claim 1, wherein the semiconductor memory is a Dynamic Random Access Memory (DRAM).

9. A method of detecting a leaky bitline in DRAM comprising the steps of:

disabling a bitline equalizer to create a floating bitline test mode;

initiating at least one dummy timing cycle at the beginning of the test mode using a VLSI tester, said at least one dummy timing cycle being digitally controllable by said VLSI tester; and determining the presence of a defective bitline during the at least one dummy timing cycle.

10. The method according to claim 9, further comprising the step of repairing a defective bitline with a column redundancy.

11. The method according to claim 9, wherein said step of disabling the bitline equalizer comprises the step of generating a negative pulsed $\overline{TEST}$ signal by detecting the completion of a WCBR operation.

* * * * *